(12) United States Patent
Hu et al.

(10) Patent No.: US 9,429,303 B2
(45) Date of Patent: Aug. 30, 2016

(54) BACKLIGHT SOURCE AND MANUFACTURING METHOD THEREOF

(71) Applicant: Shenzhen China Star Optoelectronics Technology Co., Ltd., Shenzhen, Guangdong (CN)

(72) Inventors: Che-Chang Hu, Guangdong (CN); Kuang Yao Chang, Guangdong (CN); Qian Cao, Guangdong (CN); Chong Xiong, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 666 days.

(21) Appl. No.: 13/825,008

(22) PCT Filed: Feb. 21, 2013

(86) PCT No.: PCT/CN2013/071748
§ 371 (c)(1),
(2) Date: Mar. 18, 2013

(87) PCT Pub. No.: WO2014/117418
PCT Pub. Date: Aug. 7, 2014

(65) Prior Publication Data
US 2015/0300609 A1    Oct. 22, 2015

(30) Foreign Application Priority Data

Jan. 31, 2013  (CN) .......................... 2013 1 0038415

(51) Int. Cl.
*F21V 19/00*   (2006.01)
*F21V 29/83*   (2015.01)
(Continued)

(52) U.S. Cl.
CPC ........... *F21V 19/0015* (2013.01); *F21V 29/83* (2015.01); *G02F 1/133603* (2013.01);
(Continued)

(58) Field of Classification Search
CPC .... H05K 1/05; H05K 1/0277; H05K 1/0278; H05K 1/0207; H05K 2201/10106; H05K 3/303; H05K 3/44; G02F 2001/133612; G02F 1/133603; F21V 19/0015; F21V 29/83; F21V 29/004; F21V 29/763; F21W 2131/103; F21W 2131/105
USPC ...... 362/612, 613, 631, 249.01, 296.04, 646
See application file for complete search history.

(56) References Cited

U.S. PATENT DOCUMENTS 6,517,218 B2 *  2/2003  Hochstein .............. F21S 48/215
                                                          257/712
6,726,502 B1 *  4/2004  Hayes .................... F21V 21/002
                                                          439/422

(Continued)

*Primary Examiner* — Anh Mai
*Assistant Examiner* — Arman B Fallahkhair

(57) ABSTRACT

Disclosed are a backlight source and a manufacturing method thereof, wherein the method of manufacturing the backlight source comprises the following steps: forming a base layer, a dielectric layer, and a conductive layer stacked successively from bottom to top to form a semi-finished PCB; the semi-finished PCB is divided into a light bar area and a heat dissipating area; the conductive layer is divided into a first conductive area and a second conductive area insulated from each other; etching the second conductive area to form a preset conductive circuit; spraying insulating paint upon the conductive layer to form the insulating layer, thus producing the PCB; and installing the LED onto the light bar area and making it in electrical connection with the second conductive area.

4 Claims, 5 Drawing Sheets

(51) Int. Cl.
  *H05K 3/30* (2006.01)
  *G02F 1/1335* (2006.01)
  *H05K 1/05* (2006.01)
  *H05K 3/44* (2006.01)
  *H05K 1/02* (2006.01)
  *F21Y 101/02* (2006.01)

(52) U.S. Cl.
  CPC ............... *H05K1/05* (2013.01); *H05K 3/303* (2013.01); *H05K 3/44* (2013.01); *F21Y 2101/02* (2013.01); *G02F 2001/133612* (2013.01); *H05K 1/0277* (2013.01); *H05K 2201/10106* (2013.01)

(56) References Cited

U.S. PATENT DOCUMENTS

| | | | | |
|---|---|---|---|---|
| 7,791,089 B2* | 9/2010 | Bisberg | ............... | H01L 33/58 257/100 |
| 8,556,489 B2* | 10/2013 | Cheng | ............... | H04M 1/22 362/612 |
| 8,730,429 B2* | 5/2014 | Lee | ............... | G02F 1/133385 349/161 |
| 8,958,022 B2* | 2/2015 | Youk | ............... | G02B 6/0083 349/161 |
| 2011/0182054 A1* | 7/2011 | Lee | ............... | H01L 25/0753 362/84 |
| 2013/0258251 A1* | 10/2013 | Lee | ............... | H05K 1/0209 349/69 |

\* cited by examiner

US 9,429,303 B2

BACKLIGHT SOURCE AND MANUFACTURING METHOD THEREOF

FIELD OF THE INVENTION

The present invention relates to the field of liquid crystal display, especially to a backlight source used in the side-in liquid crystal display device and the manufacturing method thereof.

BACKGROUND OF THE INVENTION

The liquid crystal display device, e.g. a liquid crystal television (TV) and a liquid crystal display, has been widely used because of its numerous advantages such as thin body, energy saving, and no radiation. Most of the liquid crystal display devices available on the current market are backlight-type liquid crystal display devices, which include a liquid crystal panel and a backlight module, with the backlight module as one of the key components of the liquid crystal display device. The backlight module is classed into a side-in backlight module and a direct type backlight module based on the incident position of the light source; wherein for the side-in backlight module, the LED light bar of the light source is arranged at the edge of the backplane behind the liquid crystal panel, and the light emitted from the LED light bar enters a light guide plate through a light-entering face at a side of the light guide plate, then is emitted from a light-outgoing face of the light guide plate after reflection and diffusion, and finally forms a surface light source for the liquid crystal panel via an optical film group. Because the side-in backlight module needs less LEDs than the direct type backlight module, it has many advantages such as a low cost and being conducive to making the liquid crystal display device have a narrow frame and be ultra thin, and is thus being used more and more widely.

However, because the width of the LED light bar of the side-in backlight module needs to keep consistent with the thickness of the light guide plate, the width of its frame cannot be reduced infinitely. The subsidiary structure of the side-in backlight module has to be simplified for further reducing its thickness. As shown in FIG. 1, an existing side-in backlight source is generally composed of an LED 1, a PCB 2 and a heatsink 3, wherein the LED 1, because of the high heat productivity itself, needs to be attached to the heatsink 3 by a thermal conductive adhesive 4 for dissipating heat sufficiently. Because of the presence of the heatsink, it is very limited to reduce the thickness of the frame of the liquid crystal display device in this structure. As shown in FIG. 2, if the heatsink is removed from this backlight source, the entire thickness of the backlight source can be significantly reduced; however, after the thickness is reduced, due to the lack of the heatsink, the heat dissipation of the LED light bar then becomes a very big problem.

SUMMARY OF THE INVENTION

The technical problem to be solved by the present invention is to provide a backlight source used in the side-in liquid crystal display device and a manufacturing method thereof, so as to overcome the defect of the backlight source in the prior art that removal of the heatsink results in poor heat dissipation.

The present invention adopts the following technical solution to solve its technical problem:

according to one aspect of the present invention, a backlight source is provided, which includes a PCB, as well as a plurality of LEDs installed on and electrically connected with the PCB; the PCB includes a base layer, a dielectric layer, a conductive layer and an insulating layer stacked successively from bottom to top; the PCB is closed at its top by the insulating layer; the PCB includes a light bar area for LED installation and a heat dissipating area for heat dissipation that are respectively arranged in planes perpendicular to each other; the conductive layer is divided into a first conductive area on the heat dissipating area and a second conductive area on the light bar area that are insulated from each other.

Preferably, the base layer is an aluminum base layer, and both the first conductive area and the second conductive area are a copper layer.

Preferably, the conductive layer is provided with an open slot making the first conductive area and the second conductive area insulated from each other, with the open slot communicating at its bottom with the dielectric layer; the open slot is located at the border between the light bar area and the heat dissipating area.

Preferably, the first conductive area and the second conductive area are provided respectively with a test point used for the short-circuit test.

On the other hand, the present invention provides a method of manufacturing the backlight source, which comprises the following steps:

S1. forming a base layer, a dielectric layer, and a conductive layer stacked successively from bottom to top, thus forming a semi-finished PCB;

S2. dividing the semi-finished PCB into a light bar area for installation of a plurality of LEDs and a heat dissipating for heat dissipation;

S3. dividing the conductive layer into a first conductive area on the heat dissipating area and a second conductive area on the light bar area that are insulated from each other;

S4. etching the second conductive area to form a preset conductive circuit;

S5. spraying insulating paint upon the conductive layer to form the insulating layer, thus producing PCB; and S6. installing a plurality of LEDs on the light bar area of PCB, making them electrically connected with the second conductive area.

Preferably, the step S3 is specifically as follows:

The conductive layer is provided with an open slot making the first conductive area and the second conductive area insulated from each other, with the open slot communicating at its bottom with the dielectric layer; the open slot is formed from cutting by a knife or etching Preferably, the base layer is an aluminum base layer, and both the first conductive area and the second conductive area are a copper layer.

Preferably, the open slot of the conductive layer is located at the border between the light bar area and the heat dissipating area.

Preferably, the semi-finished PCB is further bent along the open slot after the step S5, making the light bar area and the heat dissipating area respectively in two planes perpendicular to each other.

Preferably, after the step S4, the first conductive area and the second conductive area are further provided respectively with a test point used for the short-circuit test.

The backlight source of the present invention and the manufacturing method thereof have the following advantages or beneficial effects: the metal core printed circuit board having a good heat dissipating effect is used in the present invention, and the light bar area and the heat dissipating area for heat dissipation is provided, such that the heatsink can be removed under the premise of not affecting the heat dissipating effect, which significantly reduces the entire thickness of the backlight source; the conductive layer is divided into a first conductive area on the heat dissipating area and a second conductive area on the light bar area that are insulated from each other, a conductive circuit of the backlight source is formed on the second conductive area of the light bar area, and the heat dissipating capacity of the backlight source is improved by reserving the first conductive area on the heat dissipating area.

BRIEF DESCRIPTIONS OF THE DRAWINGS

For explaining the technical solution of the examples of the present invention more clearly, the drawings to be used in the examples will be briefly introduced in the following. Obviously, the drawings below are only some examples of the present invention, and those of ordinary skill in the art can further obtain other drawings according to these drawings without making any inventive effort. In the drawings.

DETAILED DESCRIPTION OF THE EMBODIMENTS

In order to make the purpose, technical solutions and advantages of the present invention clearer, various examples will be described below with reference to the corresponding drawings which constitute a part of the examples, wherein various examples that may be used in the present invention are described. It should be understood that other examples can also be used, or amendments can be made in structure and function to the examples enumerated in this text, without departing from the scope and substance of the present invention.

Figure 1:
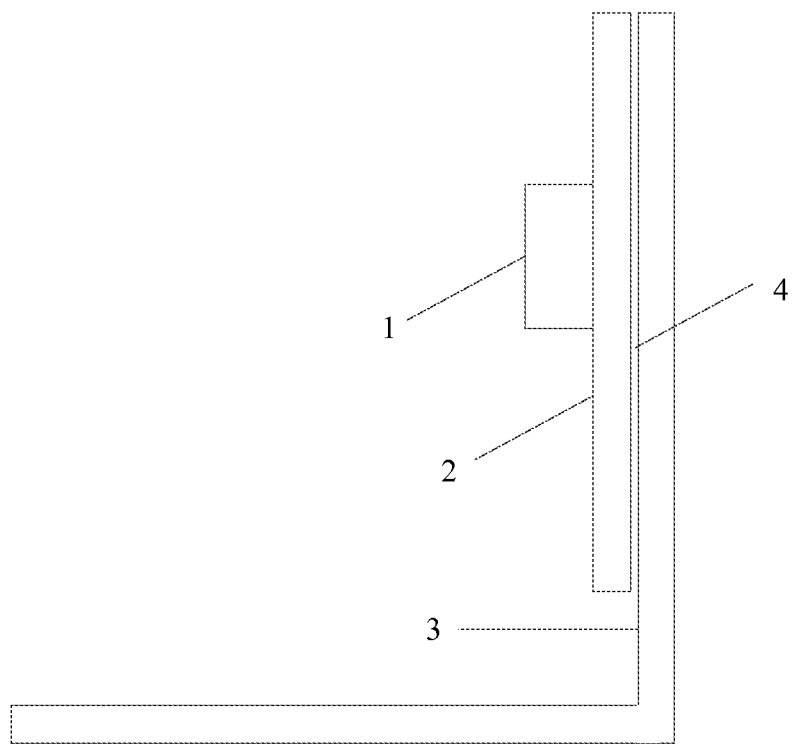
FIG. 1 is a structural schematic drawing of the backlight source in the prior art.
Figure 2:
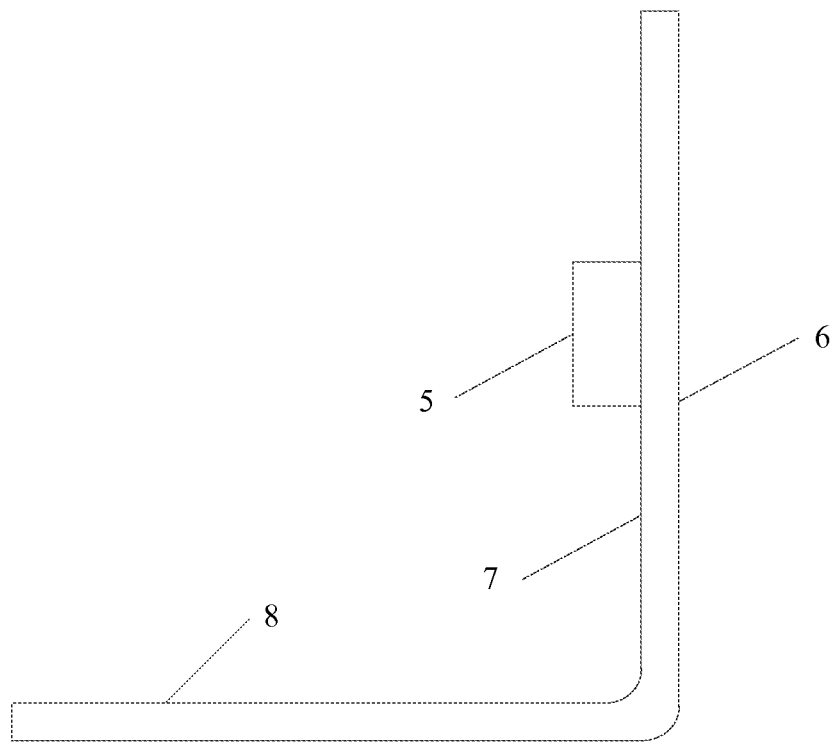
FIG. 2 is a structural schematic drawing of the backlight source as shown in FIG. 1 after the heatsink is removed.
Figure 4:
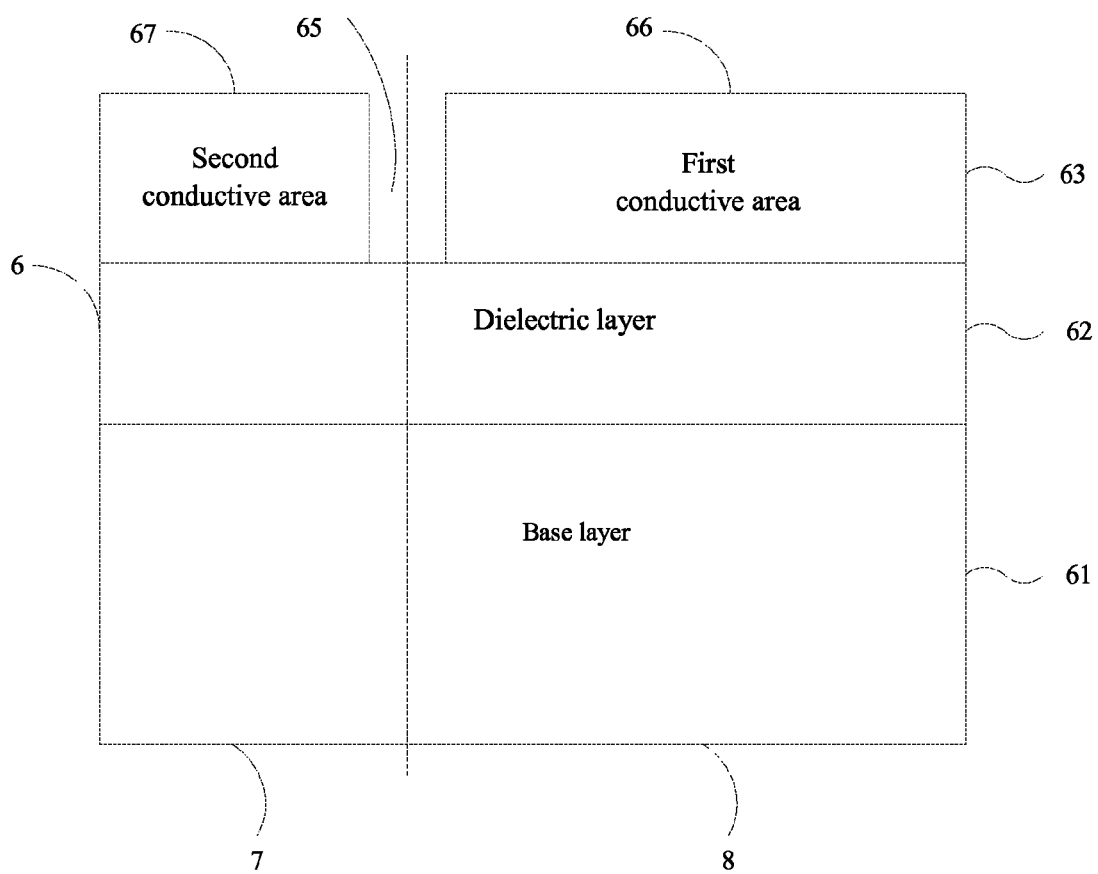
FIG. 4 is a schematic drawing of the entire shape of the open slot of PCB as shown in FIG. 2.

As shown in FIGS. 2 and 4, the present invention provides an example of a backlight source, which includes a PCB 6 (Printed Circuit Board) as well as a plurality of LED 5 (Light Emitting Diode) installed on and electrically connected with the PCB 6; wherein the PCB 6 includes a base layer 61 (Al layer), a dielectric layer 62, a conductive layer 63 and an insulating layer 64 successively stacked from bottom to top; the PCB 6 is closed at its top by the insulating layer 64.

Specifically, the PCB 6 includes a light bar area 7 for installation of the LED 5 and a heat dissipating area 8 for heat dissipation that are respectively arranged in planes perpendicular to each other; the conductive layer 63 is divided into a first conductive area 66 on the heat dissipating area 8 and a second conductive area 67 on the light bar area 7 that are insulated from each other. Wherein the base layer is preferably an aluminum base layer, and the conductive layer is preferably a copper layer. The present invention will be described below by taking the base layer and the conductive layer as an example, which, however, does not limit the present invention.

Specifically, the conductive layer 63 is provided with an open slot 65 making the first conductive area 66 and the second conductive area 67 insulated from each other, with the open slot 65 communicating at its bottom with the dielectric layer 62, thus making the first conductive area 66 and the second conductive area 67 at both sides of this open slot 65 disconnected from each other completely, thus in no contact with and insulated from each other. For better heat dissipation of the LED 5, the light bar area 7 and the heat dissipating area 8 are arranged respectively in planes perpendicular to each other, i.e., the light bar area 7 and the heat dissipating area 8 are arranged in L-shaped. Besides, the open slot 65 of the conductive layer 63 is located at the border between the light bar area 7 and the heat dissipating area 8, making the second conductive area 67 of the light bar area 7 disconnected completely from the first conductive area 66 of the heat dissipating area 8. Moreover, the first conductive area 66 covers most or all of the heat dissipating area 8, which strengthening the heat dissipating capacity of the heat dissipating area 8.

In order to prevent the heat dissipating area 8 of the backlight source from getting short circuit due to the residue of the conductive layer 63, the second conductive area 67 of the light bar area 7 and the first conductive area 66 of the heat dissipating area 8 are provided respectively with a test point 9 used for the short-circuit test, so as to make a short circuit test for the light bar area 7 and the heat dissipating area 8, thus preventing from getting short circuit between the first conductive area 66 and the second conductive area 67, thereby preventing the LED 5 from being burnt out.

Figure 3:
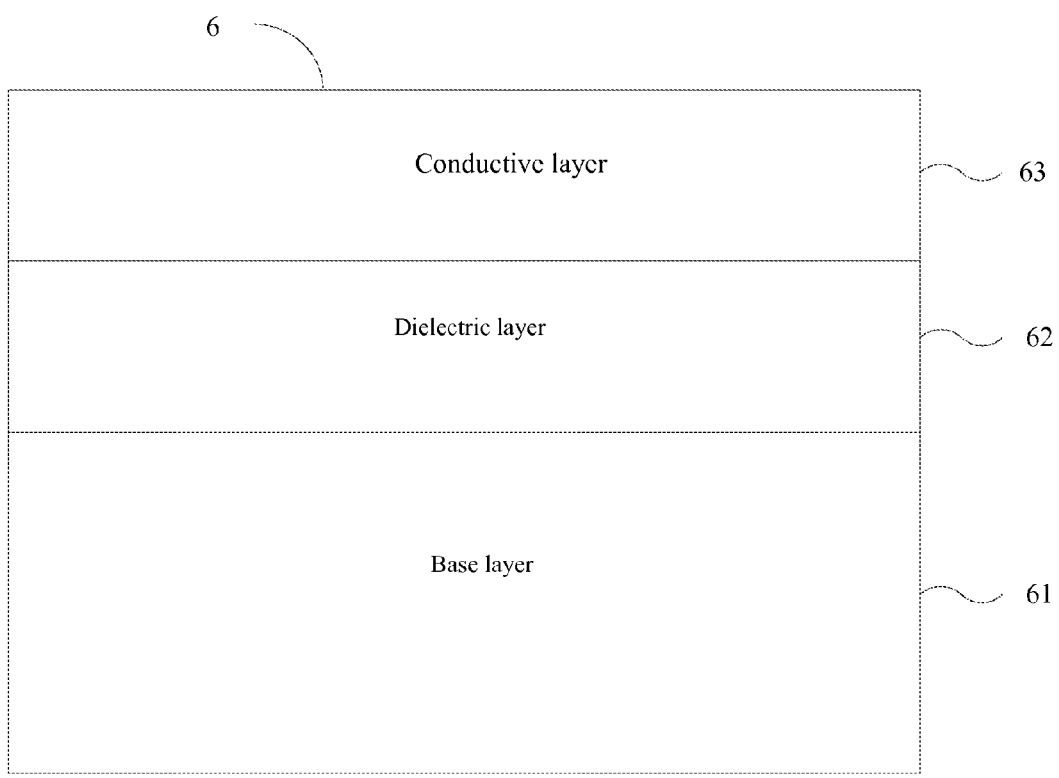
FIG. 3 is a structural schematic drawing of PCB in an example of the backlight source of the present invention.

In the example of the method of manufacturing the backlight source of the present invention, because the light bar area 7 and the heat dissipating area 8 of PCB are arranged in L-shaped, their manufacturing processes are relatively complicated and include specifically the following manufacturing steps:

(1) Forming a base layer (Al layer) 61, a dielectric layer 62, and a conductive layer 63 successively stacked from bottom to top, thus forming a semi-finished PCB, wherein the specific manufacturing process thereof is similar to that of the traditional MCPCB (Metal Core PCB, metal core printed circuit board), as shown in FIG. 3.

(2) Dividing the semi-finished PCB into a light bar area 7 used for installation of a plurality of LED 5 and a heat dissipating area 8 used for heat dissipation.

(3) Dividing the conductive layer 63 into a first conductive area 66 on the heat dissipating area 8 and a second conductive area 67 on the light bar area 7 that are insulated from each other. Wherein the base layer is preferably an aluminum base layer, and the conductive layer is preferably a copper layer. The present invention will be described below by taking the base layer and the conductive layer as an example, which, however, does not limit the present invention.

(4) Etching the second conductive area 67 to form a preset conductive circuit (pattern).

When the conductive layer is etched, after the conductive circuit of the second conductive area 67 is designed, the conductive layer 63 is provided with an open slot 65 making the first conductive area 66 and the second conductive area 67 insulated from each other, with the open slot 65 communicating at its bottom with the dielectric layer 62, thereby making the first conductive area 66 disconnected from the second conductive area 67 completely without short circuit.

Figure 5:
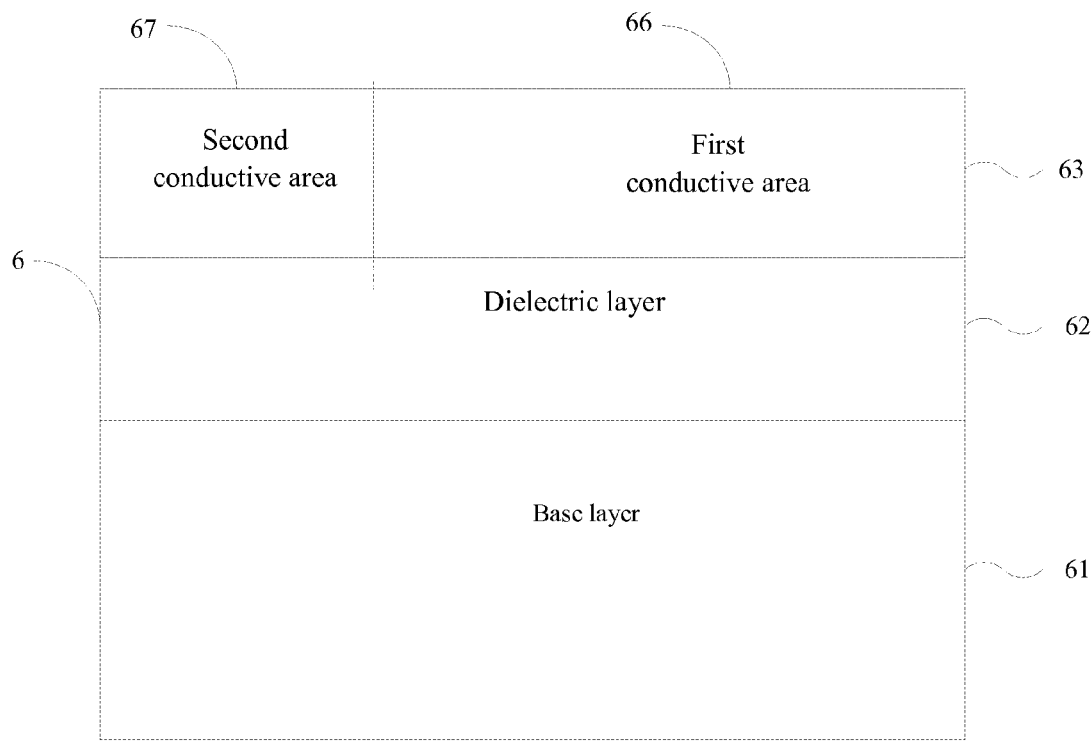
FIG. 5 is a schematic drawing of the position of the open slot formed on PCB as shown in FIG. 2.

The open slot 65 is formed from cutting by a knife or etching The cutting process by a knife is as follows: while the conductive layer is etched, the conductive layer 63 is cut into a first conductive area 66 and a second conductive area 67 for the border between the light bar area 7 and the heat dissipating area 8; for ensuring cutting off, the knife should goes down into the dielectric layer 62, thereby forming an open slot 65 disconnecting the light bar area 7 completely from the conductive layer 63 of the heat dissipating area 8, as shown in FIG. 5.

The etching process is as follows: the conductive layer of the heat dissipating area 8 close to the light bar area 7 is washed away to form an open slot 65, so as to ensure that under the insulation condition the first conductive area 66 of the heat dissipating area is reserved as far as possible, thereby making the first conductive area 66 cover most or all of the heat dissipating area 8, thus the heat dissipating capacity of the backlight source is strengthened, as shown in FIG. 4.

(5) The first conductive area 66 and the second conductive area 67 are provided respectively with a test point 9 used for the short-circuit test, so as to prevent the first conductive area 66 and the second conductive area 67 of the backlight source from getting short circuit because of the residue of the conductive layer.

Figure 6:
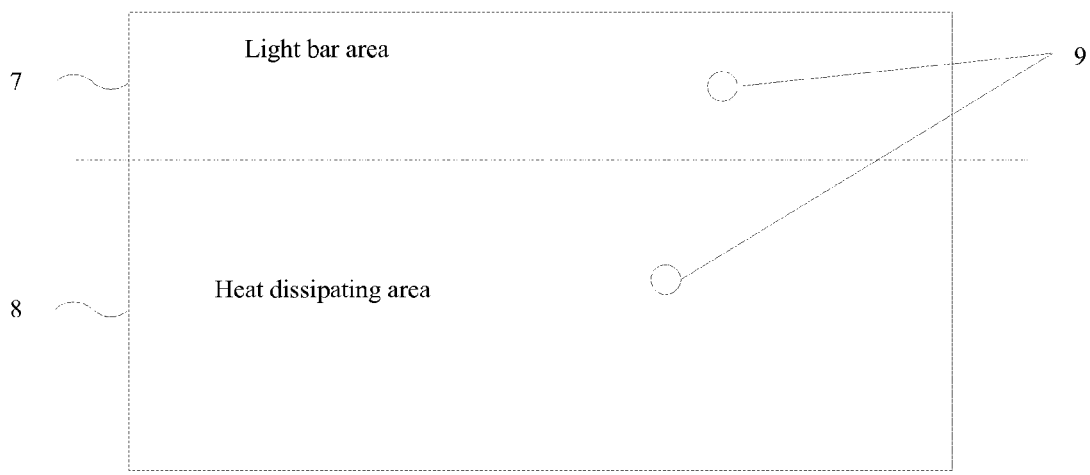
FIG. 6 is a schematic drawing of the test point of PCB as shown in FIG. 2.

Specifically, as shown in FIG. 6, while the conductive layer 63 is etched, the first conductive area 66 of the heat dissipating area 8 is provided with a test point 9 (there is no limit to the position of the test point), and the second conductive area 67 of the light bar area 7 is also provided with a test point 9 (there is no limit to the position of the test point). By detection of the set test points, the first conductive area 66 of the heat dissipating area 8 is prevented from getting short circuit between the first conductive area 66 and the light bar area 7, thus avoiding short circuit, thereby preventing the LED 5 from being burnt out.

Figure 7:
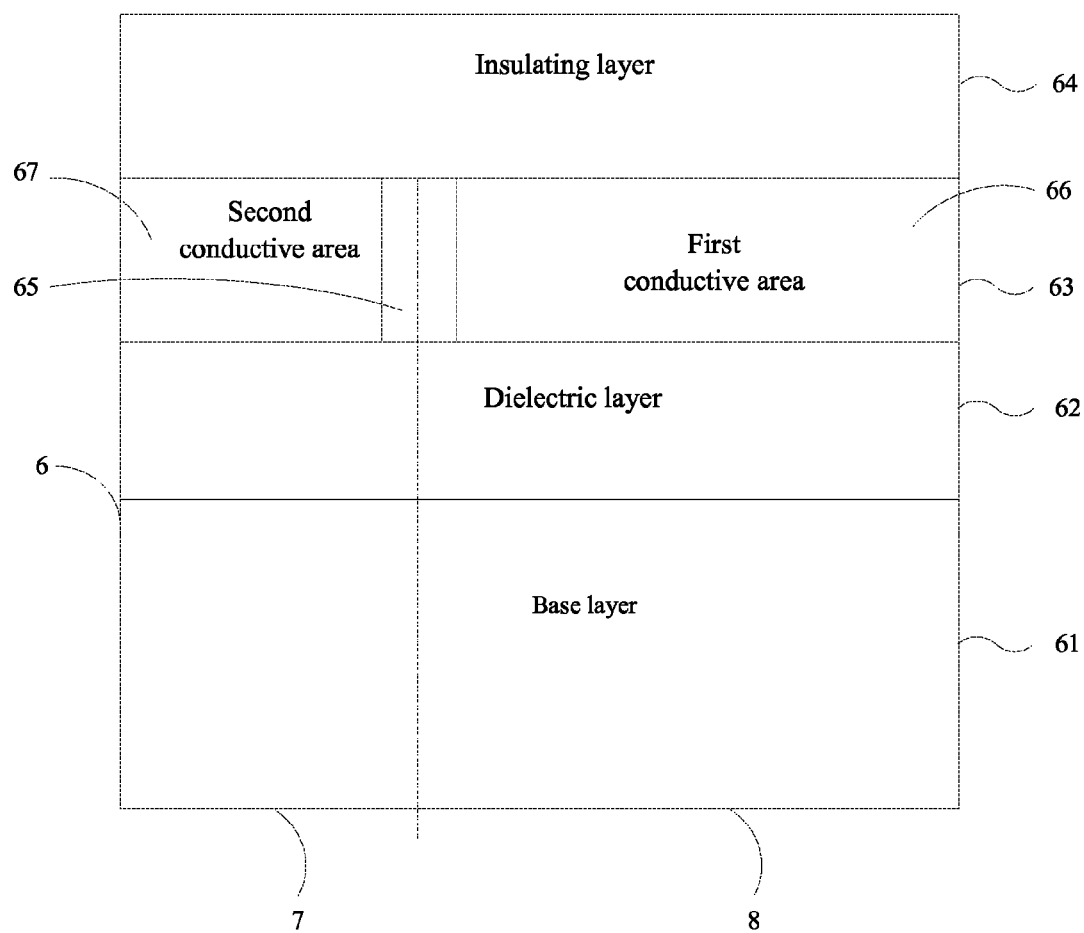
FIG. 7 is a schematic drawing of the entire shape of PCB as shown in FIG. 2.

(6) Spraying insulating paint upon the conductive layer 63 to form the insulating layer 64, thus producing PCB, as shown in FIG. 7. This insulating layer 64, in addition to the traditional function of preventing short circuit, is further used for closing the top of the open slot 65, so as to prevent impurities such as the exterior dust and humidity from arriving at the conductive layer 63 and the dielectric layer 62 from the open slot 65 to affect the function of PCB.

(7) Bending the semi-finished PCB 6 along the open slot 65, making the light bar area 7 and the heat dissipating area 8 respectively in two planes perpendicular to each other.

(8) A plurality of LED 5 are installed onto the light bar area 7 of the PCB 6, and made in electrical connection with the second conductive area 67. Finally the bent type backlight source as shown in FIG. 2 is formed.

The conductive layer of the present invention is divided into a first conductive area on the heat dissipating area and a second conductive area on the light bar area that are insulated from each other, and the first conductive area of the heat dissipating area is reserved, thus strengthening the heat dissipating capacity of the backlight source. The first conductive area and the second conductive area are provided respectively with a test point for making a short circuit test, so as to prevent from getting short circuit between the first conductive area and the second conductive area, thereby preventing LED from being burnt out.

All the above are only the preferred examples of the present invention. As known by those skilled in the art, various changes or equivalent substitution can be made to these features and examples without departing from the spirit and scope of the present invention. Besides that, under the guidance of the present invention, these features and examples can be amended so as to adapt to the specific circumstance and materials without departing from the spirit and scope of the present invention. Therefore, the present invention is free from restriction of the specific examples disclosed here, and all the examples falling within the scope of the claims of this application fall within the scope of protection of the present invention.

What is claimed is:

1. A backlight source, comprising a PCB as well as a plurality of LEDs installed on and electrically connected with the PCB; the PCB includes a base layer, a dielectric layer, a conductive layer and an insulating layer stacked successively from bottom to top; the PCB is closed at its top by the insulating layer; the PCB includes a light bar area for installation of the LED and a heat dissipating area for heat dissipation that are respectively arranged in planes perpendicular to each other;
   the conductive layer is divided into a first conductive area on the heat dissipating area and a second conductive area on the light bar area that are insulated from each other;
   wherein the conductive layer is provided with an open slot making the first conductive area and the second conductive area insulated from each other, with the open slot communicating at its bottom with the dielectric layer, and the bottom of the open slot is not communicated with the base layer;
   the light bar area and the heat dissipating area are arranged respectively in planes perpendicular to each other, wherein bending a semi-finished PCB along the open slot, making the light bar area and the heat dissipating area respectively in two planes perpendicular to each other.

2. The backlight source according to claim 1, wherein the base layer is an aluminum base layer, and both the first conductive area and the second conductive area are a copper layer.

3. The backlight source according to claim 2, wherein the first conductive area and the second conductive area are provided respectively with a test point used for a short-circuit test.

4. The backlight source according to claim 1, wherein the open slot is located at the border between the light bar area and the heat dissipating area.

* * * * *